June 12, 1973 LE CONTE CATHEY 3,738,873

SELF GENERATING THERMOELECTRIC CONVERTER

Filed Dec. 23, 1964

INVENTOR.
L. CATHEY

BY

Roland A. Anderson

Attorney.

United States Patent Office 3,738,873
Patented June 12, 1973

3,738,873

SELF GENERATING THERMOELECTRIC CONVERTER

Le Conte Cathey, Aiken, S.C., assignor to the United States of America as represented by the United States Atomic Energy Commission Filed Dec. 23, 1964, Ser. No. 420,840
Int. Cl. G21h *1/10*
U.S. Cl. 136—202 5 Claims

ABSTRACT OF THE DISCLOSURE

A single body semiconductor made of a radioactive element having a radioactive isotope heat source of the same element as an integral part thereof. The semiconductor is a compound including radioactive actinide element, such as plutonium, uranium or thorium, and the heat source is a heat-producing radioactive isotope of the same element. Suitable doping impurities, diffused into part of the semiconductor bar, shift the electrical potential distribution across the center portion to produce the thermoelectric element.

This invention relates generally to radioactive or thermoelectric generators of the type utilizing semiconducting materials. More particularly the invention relates to a self energized thermoelectric converter wherein a semiconductor material and an isotopic heat source material are combined in an integral body of semiconducting material.

There is an increasing need for electric power generators for use in areas or functions that cannot be fulfilled by central stations and for continuous and reliable remote applications, especially in the field of space exploration in satellites, for example. The three major requirements for a satellite power supply are extreme reliability, high efficiency, and light weight. It is known to use thermoelectric generators employing a radioactive, or isotopic, heat source in combination with thermocouples, or thermopiles. Present isotopic power supplies are generally constructed with the heat generating isotope contained in a separate capsule from which the heat is transferred to the thermoelectric elements by "hot shoes." "Cold shoes" at the other end of the thermoelectric elements are connected to a heat sink or radiator to form a cold junction. Mismatches in chemical behavior, thermal expansion, and mechanical properties of the material at the hot junctions result in devices that are prone to failure due to shock, load cycling, or materials aging. The most common cause of failure in thermoelectric devices are cracking at junctions between the heat source and the thermoelements. Such failure has, in fact, been a main source of unreliability in isotopic power generators. Moreover, the junction mismatches pose temperature limits on the devices such that the hot junction must usually operate below 500–600° C., i.e., at low efficiencies.

It is an object of this invention to provide an isotopic electric power generator wherein a heat source and thermoelectric converter are one integral piece.

It is a still further object of the invention to provide a thermoelectric generator comprised of an integral semiconductor and heat source having extreme reliability, high efficiency, and light weight.

The above objects are achieved in accordance with this invention by providing a single body semiconductor having a heat generating isotope as an integral part thereof. The basic unit consists of a single bar semiconductor made of a radioactive element, preferably an actinide. The outer regions of the bar are fabricated from a long-lived isotope of a radioactive element while the center portion is enriched with a shorter-lived heat producing isotope of the same element. Appropriate contaminants, or impurities diffused into part of the bar shift the electrical potential distribution across the center portion to thereby produce the thermoelectric element. The ends of the bar are connected to heat sinks.

Figure 1:
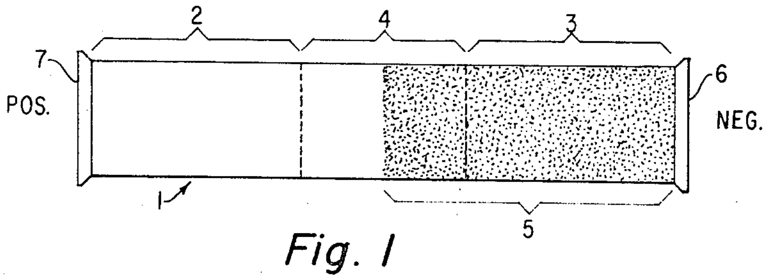
Figure 2:
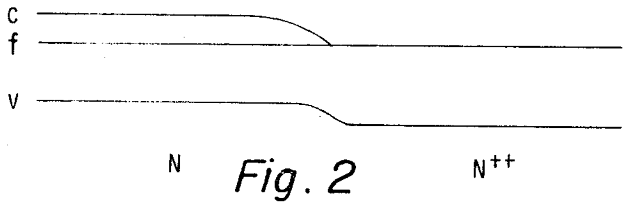

Additional objects and advantages of the invention will become apparent from the following description when taken in conjunction with the accompanying drawing in which: FIG. 1 in an elevation view of an exemplary embodiment of the thermoelectric generator of the present invention. FIG. 2 is a graphic illustration of the manner in which the electrical potential distribution is shifted across the center porton of the thermoelectric generator of FIG. 1.

In FIG. 1, the thermoelectric generator of the invention is in the shape of an elongated bar, generally indicated at 1, made of a semiconductor material such as the compound plutonium telluride. The bar may be produced by some generally known compounding process or powder metallurgy, for example. In this embodiment $^{239}Pu$ is used as a long-lived isotope which is principally disposed in the outer regions 2 and 3 of the bar. In the center region 4 a heat producing isotope $^{238}Pu$ is substituted for the $^{239}Pu$. One-half of the bar 5 is doped by diffusing contaminants or impurities thereinto in a manner well known in the semiconductor and transistor art. This is a carefully controlled process and is done in this case to produce the thermoelectric element having the desired polarities at the opposite ends of the bar. In the example illustrated in the figure, the right half of the bar is doped with an impurity which will produce N-type material, thus making the right end of the bar negative.

The ends of the bars 6 and 7 are thermally connected to a heat sink, or cold shoe, thereby providing cold junctions for producing the thermoelectric, or Seebeck, effect.

The manner in which the doping shifts the electrical potential distribution across the center portion is graphically illustrated in FIG. 2. The line *f* represents the Fermi level for the material under consideration. The line *c* indicates the conduction band and the line *v* indicates the valence band for this material. These terms are defined in most text books on semiconductors and transistors; e.g., "Transistor Physics and Circuits" by R. L. Riddle and M. P. Ristenbatt, Prentice Hall, Inc., Englewood Cliffs, N.J., 1958, Chapter 3. It will be noted that the left portion of the bar has current carriers in the conduction band and valence band. In the right half of the bar dominant current carrier is in the conduction band and the current carrier in the valence band is of a lower energy level than that in the left half of the bar. The left side has a large electron concentration in the conduction band to minimize the conductivity losses through this region. The right hand side of the bar is appropriately doped to increase the carrier concentration even higher. The concentration at any point in the bar will be dependent on the local temperature created by the heat source. Thus there will be a gradient along each half of the bar between the center and cold ends. The potential difference existing between the ends of the bar will be dependent upon the equilibrium carrier concentration and the left half of the bar will be at a higher potential than the right half at a diffusion equilibrium condition. This potential is the source of the terminal voltage of the device. The terminal voltage is dependent upon internal resistance drops so the material conductivity must be maintained as high as possible without loss of terminal potential.

In use, the ends 6 and 7 of the bar are electrically connected to an external load, not shown. The power of the device depends upon the types and quantities of heat source material, semiconductor material, and the impurity material which is used to dope the bar. In the preferred embodiment the semiconductor is PuTe and the doping impurity may be lithium, aluminum, zinc, phosphorus, arsenic, or gallium, for example. Other semiconductor materials might be compounds of uranium, or thorium, with one of the following; tellurium, selenium, antimony, sulphur, phosphorus, carbon. In the case of uranium, the heat source isotope might be $^{232}$U and the carrier isotope $^{238}$U. For thorium, the heat source isotope might be $^{228}$Th and the carrier isotope $^{232}$Th. The doping material might be any of those listed above. The composition of the bar, doping, and the dimensions are selected to give a high Seebeck coefficient, a relatively high electrical conductivity and a low thermal conductivity. The sides of the bar may be termally insulated in order to maintain a maximum temperature gradient from the heat source to the sink for optimum output.

The unique geometry of this thermoelectric generator offers substantial gains in meeting the three basic requirements for satellite power supplies by eliminating all hot junctions and resultant cracking at such junctions between the heat source and the thermoelements, greatly increasing the efficiency by higher permissible temperatures, and decreasing the weight considerably due to the simple construction.

It is not intended that the invention be limited to the specific embodiment illustrated herein, but only by the scope of the appended claims.

What is claimed is:

1. A thermoelectric generator comprising a radioactive element in semiconductor form having a particular radioactive isotope of said element as a heat source in the center of the semiconductor, said particular radioactive isotope being different from the isotopes of said element in the other portions of the semiconductor, heat sinks at portions remote from the heat source, and an impurity doped into said semiconductor between the heat source and one heat sink to produce opposite polarities at the heat sinks.

2. The thermoelectric generator of claim 1 wherein the semiconductor is a compound of tellurium with an element selected from the group consisting of plutonium, uranium, and thorium, the particular radioactive isotope heat source material is selected from the group of isotopes consisting of $^{238}$Pu, $^{232}$U, and $^{228}$Th, respectively, and the other portions of the semiconductor between the heat source and heat sink is selected from the group of isotopes consisting of $^{239}$Pu, $^{238}$U, and $^{232}$Th, respectively.

3. The thermoelectric generator of claim 2 wherein said impurity is an element selected from the group consisting of lithium, aluminum, zinc, gallium, phosphorus, and arsenic.

4. A thermoelectric generator comprising an elongated semiconductor bar of plutonium telluride, the center region of the bar containing the ratioactive isotope heat source $^{238}$Pu and the outer regions containing the isotope $^{239}$Pu, an impurity material selected from the group consisting of Li, Al, Zn, Ga and As diffused into half of the bar to produce opposite polarities at the ends of the bar, and a heat sink in thermal contact with each end of the bar.

5. An isotopic electric power generator comprising a semiconductor made of a compound of an actinide element, a heat source portion of the semiconductor containing a particular radioactive isotope of the actinide element having a relatively high specific power and being different from the isotopes of said element in the remainder of said semiconductor, the actinide isotopes in the remainder of the semiconductor having a relatively low specific power, two heat sinks thermally connected to the semiconductor remote from said heat source, and an impurity doped into the semiconductor to produce oppositely charged terminals near the heat sinks.

References Cited

UNITED STATES PATENTS

| | | | |
|---|---|---|---|
| 3,257,570 | 6/1966 | Dehmelt et al. | 310—3 R |
| 2,876,368 | 3/1959 | Thomas | 310—3 R |
| 2,976,433 | 3/1961 | Rappaport | 252—301.1 X |

FOREIGN PATENTS

| | | | |
|---|---|---|---|
| 955,019 | 4/1964 | Great Britain | 252—301.1 X |

OTHER REFERENCES

Westinghouse Electric Corporation, Thermoelectric Nuclear Fuel Element Quarterly Progress Report; July 1960, WSAP–1596.

HARVEY E. BEHREND, Primary Examiner

U.S. Cl. X.R.

136—236, 238; 252—301.1; 310—3 R